United States Patent [19]

Inagawa et al.

[11] Patent Number: 4,567,568

[45] Date of Patent: Jan. 28, 1986

[54] APPARATUS FOR DIVIDING THE ELEMENTS OF A GALOIS FIELD

[75] Inventors: Jun Inagawa, Yokohama; Masahide Nagumo, Kawasaki; Tadashi Kojima, Yokosuka, all of Japan

[73] Assignee: Tokyo Shibaura Denki Kabushiki Kaisha, Kawasaki, Japan

[21] Appl. No.: 473,767

[22] Filed: Mar. 10, 1983

[30] Foreign Application Priority Data

Jun. 15, 1982 [JP] Japan ............................. 57-102804
Jun. 15, 1982 [JP] Japan ............................. 57-102807

[51] Int. Cl.$^4$ .................................................. G06F 7/52
[52] U.S. Cl. ........................................ 364/761; 364/765
[58] Field of Search ....................... 364/761, 764, 765; 371/37

[56] References Cited

U.S. PATENT DOCUMENTS

| 3,533,067 | 10/1970 | Zierler et al. | 371/37 |
| 3,633,018 | 1/1972 | Ling | 364/765 |
| 4,142,174 | 2/1979 | Chen | 371/37 |
| 4,162,480 | 7/1979 | Berlekamp | 371/37 |
| 4,473,887 | 9/1984 | Odaka | 364/761 |

FOREIGN PATENT DOCUMENTS 2050014 12/1980 United Kingdom .
2079994 1/1982 United Kingdom .

OTHER PUBLICATIONS

Michelson, "Computer Implementation of Decoders for Several BCH Codes" *Proceedings of the Symposium on Computer Processing in Communications*, New York, Apr. 8-10, 1969, Polytechnik Press, Brooklyn, pp. 401-414.

Justesen, "On the Complexity of Decoding Reed-Solomon Codes" *IEEE Tran. on Infor. Theory*, vol. IT-22 No. 2, Mar. 1976, pp. 237-238.

Chen, "Multisequence Linear Shift Reg. Synthesis & Its Application to BCH Decoding" *IEEE Trans. on Communication*, vol. COM-24, No. 4, Apr. 1976 pp. 438-440.

*Primary Examiner*—David H. Malzahn
*Attorney, Agent, or Firm*—Cushman, Darby & Cushman

[57] ABSTRACT

Data representing one element $\alpha^i$ of a Galois field $GF(2^m)$ are stored in a first linear shift register, and data representing another element $\alpha^j$ of the Galois field $GF(2^m)$ are stored in a second linear shift register. $2^m$ elements of Galois field $GF(2^m)$ are divided into n groups. A table of the reciprocals of n elements located at specific positions respectively in n groups is stored in a converter which includes a decoder and an encoder. The data representing element $\alpha^j$ are supplied from the second linear shift register to the decoder. If the data representing the reciprocal of element $\alpha^j$ are stored in the converter, they are read from the encoder. If they are not stored in the converter, the first linear shift register and the second linear shift register are shifted N times by control pulses generated by a NOR gate and an AND gate until any one of the reciprocal data are read from the encoder, whereby the register supplies data representing $\alpha^{i+N}$ and the register supplies data representing $\alpha^{-(j+N)}$. A multiplier multiplies element $\alpha^i$ by reciprocal $\alpha^j$ or multiplies element $\alpha^{i+N}$ by reciprocal $\alpha^{-(j+N)}$, thereby performing the division: $a^i \div \alpha^j (= \alpha^{i-j})$.

2 Claims, 14 Drawing Figures

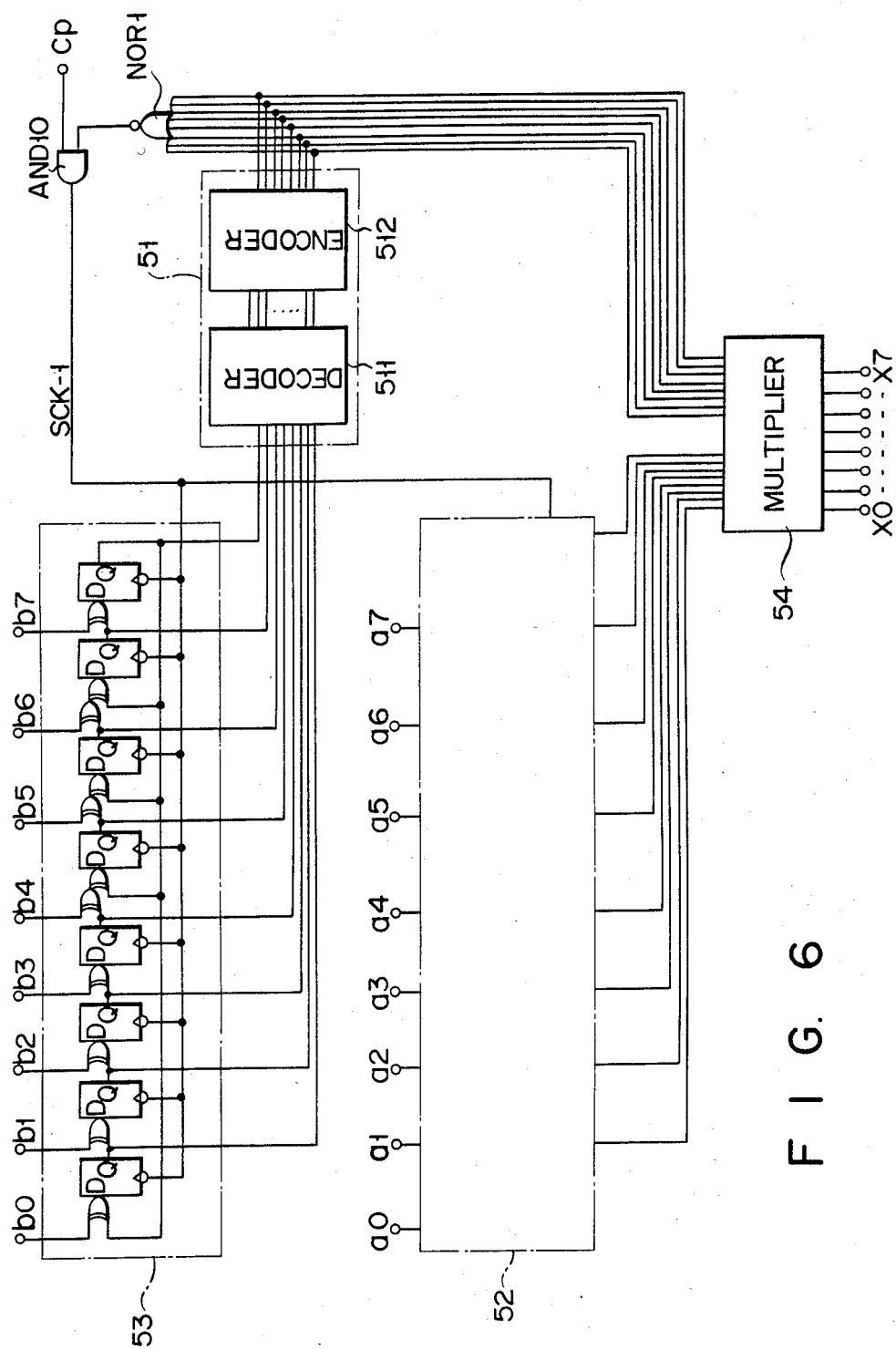
F I G. 6

APPARATUS FOR DIVIDING THE ELEMENTS OF A GALOIS FIELD

BACKGROUND OF THE INVENTION

The present invention relates to an apparatus for dividing the elements of a Galois field, which can effectively serve to decode an error correction code used in an optical DAD (digital audio disk) device using, for example, a CD (compact disk).

Various optical DAD devices have been developed recently. As is well known, in an optical DAD device using a compact disk, cross-interleaved Reed Solomon codes (CIRC) are used as error correction codes. A cross-interleaved Reed Solomon code is obtained by submitting a Reed Solomon code, which is a BCH code and which is generally regarded as the most effective random error correction code hitherto known, to a signal process called "cross-interleaving". The cross-interleaved Reed Solomon code thus obtained can correct even a burst error.

A Reed Solomon code can be decoded in the same way as is a BCH code, thereby performing an error correction.

A Reed Solomon code consisting of k data symbols and (n-k) inspection symbols, i.e., a code consisting of n symbols, is decoded in the following manner. Here, n symbols are the $2^m$ elements of a finite field called "Galois field $GF(2^m)$" which represents m binary bits. The generator polynomial $g_{(x)}$ representing a Reed Solomon code used to correct an error t times is given by the following equation (1) or (2), where $\alpha$ is the origin element of the Galois field GF $(2^m)$:

$$g_{(x)} = (x+\alpha)(x+\alpha^2), \ldots (x+\alpha^{2t}) \tag{1}$$

$$g_{(x)} = (x+\alpha^0)(x+\alpha), \ldots (x+\alpha^{2t-1}) \tag{2}$$

Let $C_{(x)}$, $R_{(x)}$ and $E_{(x)}$ denote a transmitted code word, a received code word and an error polynomial respectively, then:

$$R_{(x)} = C_{(x)} + E_{(x)} \tag{3}$$

The coefficients contained in polynomial $E_{(x)}$ are also contained in Galois field GF $(2^m)$. Hence, the error polynomial $E_{(x)}$ contains only terms which correspond to an error location and the value (i.e., size) of an error.

Let $X^j$ denote an error location, and let $Y^j$ denote the value of the error at location $X^j$. Error polynomial $E_{(x)}$ is then given as:

$$E(x) = \sum_j Y_j X^j, \tag{4}$$

where $\Sigma$ is the sum of errors at all error locations.

Here, syndrome $S_i$ is put:

$$S_i = R(\alpha^i) \ [i=0, 1, \ldots 2t-1] \tag{5}$$

Then, from equation (3):

$$S_i = C(\alpha^i) + E(\alpha^i).$$

Both C(x) and g(x) can be divided, leaving no remainder. The following therefore holds true:

$$S_i = E(\alpha^i).$$

From equation (4) it is evident that syndrome $S_i$ may be expressed as follows:

$$S_i = E(\alpha^i) = \Sigma Y_j(\alpha^i)^j = \Sigma Y_j X_j^i \tag{6}$$

where $\alpha^j = X_j$ and $X_j$ represents the error location for $\alpha^j$.

Error location polynomial $\sigma_{(x)}$ is given by:

$$\sigma_{(x)} = \pi_i (x - X_i) \tag{7}$$

$$= x^e + \sigma_1 x^{e-1} + \ldots + \sigma_e,$$

where e is the number of errors.

$\sigma_1$ to $\sigma_e$ in equation (7) are related to syndrome $S_i$ as shown below:

$$S_{i+e} + \sigma_1 S_{i+e-1} + \ldots \sigma_{e-1} S_{i+1} + \sigma_e S_i \tag{8}$$

In other words, such a Reed Solomon code as defined above is decoded in the following steps:

(I) Calculate syndrome $S_i$ [equation (5)].
(II) Obtain coefficients $\sigma_1$ to $\sigma_e$ contained in error location polynomial $\sigma_{(x)}$ [equation (8)].
(III) Find the root $X_j$ of error location polynomial $\sigma_{(x)}$ [equation (7)].
(IV) Find error value $Y_j$ [equation (6)], and calculate error polynomial [equation (4)].
(V) Correct errors [equation (3)].

Now it will be described how to decode, in the above-mentioned steps, a Reed Solomon code consisting of many blocks of data each block containing four inspection symbols. This code is represented by the following polynomial $g_{(x)}$:

$$g_{(x)} = (x+1)(x+\alpha)(x+\alpha^2)(x+\alpha^3).$$

In this case, an error can be corrected two times. The Reed Solomon code may be decoded in the following method A or the following method B.

[Method A]

(I) Find syndromes $S_0$ to $S_3$.
(II) Rewrite equation (8) for e=1 and e=2.
In the case of e=1:

$$\left.\begin{array}{l} S_1 + \sigma_1 S_0 = 0 \\ S_2 + \sigma_1 S_1 = 0 \\ S_3 + \sigma_1 S_2 = 0 \end{array}\right\}. \tag{9}$$

In the case of e=2:

$$\left.\begin{array}{l} S_2 + \sigma_1 S_1 + \sigma_2 S_0 = 0 \\ S_3 + \sigma_1 S_2 + \sigma_2 S_1 = 0 \end{array}\right\}. \tag{10}$$

Assume that the decoder used starts functioning with the case of e=1. Solution $\sigma_1$ must then be given which satisfies simultaneous equations (9). If no solution $\sigma_1$ is found, the decoder must find solutions $\sigma_1$ and $\sigma_2$ which satisfy simultaneous equations (10). If still no solution $\sigma_1$ or $\sigma_2$ is found, then: e=3.

Solution $\sigma_1$ or equations (9) is:

$$\sigma_1 = \frac{S_1}{S_0} = \frac{S_2}{S_1} = \frac{S_3}{S_2}.$$

Solutions $\sigma_1$ and $\sigma_2$ of equation (10) are:

$$\sigma_1 = \frac{S_0 S_3 + S_1 S_2}{S_1^2 + S_0 S_2}, \quad \sigma_2 = \frac{S_1 S_3 + S_2^2}{S_1^2 + S_0 S_2}.$$

(III) If coefficient $\sigma_1$ in the error location polynomial is obtained, find the root of the error location polynomial [equation (7)].

In the case of $e=1$:
$\sigma_{(x)} = x + \sigma_1 = 0$. Therefore, $X_1 = \sigma_1$.
In the case of $e=2$:

$$\sigma_{(x)} = X^2 + \sigma_1 x + \sigma_2 = 0 \quad (11)$$

Substituting the elements of Galois field $GF(2^m)$ in equation (11) one after another will yield roots $X_1$ and $X_2$.

(IV) If roots of the error location polynomial are found, determine error value $Y_j$ [equation (6)].

In the case of $e=1$: $S_0 = Y_1$. Therefore, $Y_1 = S_0$.
In the case of $e=2$:

$$\left. \begin{array}{l} S_0 = Y_1 + Y_2 \\ S_1 = Y_1 X_1 + Y_2 X_2 \end{array} \right\}$$

Therefore:

$$Y_1 = \frac{X_2 S_0 + S_1}{X_1 + X_2}$$

$$Y_2 = S_0 + Y_1.$$

(V) Correct error using correction values $Y_1$ and $Y_2$ thus obtained.

If the value of an error location is correctly found by the pointer erasure method, the Reed Solomon code used to correct an error twice can be used to correct an error four times in the following method B.

[Method B]

(I) Find syndromes $S_0$ and $S_3$.
(II), (III) Find the error location in different methods.
(IV) Find the error value [equation (6)].
In the case of $e=1$:
Same as in Method A.
In the case of $e=2$:
Same as in Method A.
In the case of $e=3$:

$$\left. \begin{array}{l} S_0 = Y_1 + Y_2 + Y_3 \\ S_1 = Y_1 X_1 + Y_2 X_2 + Y_3 X_3 \\ S_2 = Y_1 X_1^2 + Y_2 X_2^2 + Y_3 X_3^2 \end{array} \right\}$$

Solve these simultaneous equations, thus finding $Y_1$, $Y_2$ and $Y_3$:

$$Y_1 = \frac{(S_2 + X_3 S_1) + X_2(S_1 + X_3 S_0)}{(X_1 + X_2)(X_1 + X_3)}$$

$$Y_2 = \frac{(S_1 + X_3 S_0) + Y_1(X_1 + X_3)}{(S_2 + X_3)}$$

$$Y_3 = S_0 + Y_1 + Y_2.$$

In the case of $e=4$:

$$\left. \begin{array}{l} S_0 = Y_1 + Y_2 + Y_3 + Y_4 \\ S_1 = Y_1 X_1 + Y_2 X_2 + Y_3 X_3 + Y_4 X_4 \\ S_2 = Y_1 X_1^2 + Y_2 X_2^2 + Y_3 X_3^2 + Y_4 X_4^2 \\ S_3 = Y_1 X_1^3 + Y_2 X_2^3 + Y_3 X_3^3 + Y_4 X_4^3 \end{array} \right\}$$

Solve these simultaneous equations, thus finding $Y_1$, $Y_2$, $Y_3$ and $Y_4$:

$$Y_1 = \frac{[(S_0 X_4 + S_1)X_3 + (S_1 X_4 + S_2)]X_2 + (S_1 X_4 + S_2)X_3 + (S_2 X_4 + S_3)}{(X_1 + X_2)(X_1 + X_3)(X_1 + X_4)}$$

$$Y_2 = \frac{(S_0 X_4 + S_1)S_3 + (S_1 X_4 + S_2) + Y_1(X_1 + X_3)(X_1 + X_4)}{(X_2 + X_3)(X_2 + X_4)}$$

$$Y_3 = \frac{(S_0 X_4 + S_1) + Y_1(X_1 + Y_4) + Y_2(X_2 + X_4)}{(X_3 + X_4)}$$

$$Y_4 = S_0 + Y_1 + Y_2 + Y_3.$$

(V) Correct error, using correction values Y1, Y2, Y3 and Y4 thus obtained.

FIG. 1 is a block diagram of a known data correcting system which is designed to decode Reed Solomon codes in the manner described above. Data to be corrected are supplied through an input terminal IN and will be corrected by a Reed Solomon code. The data are stored in a data buffer 11 and kept stored there until a code decoding (later described) is completed. The data are supplied also to a syndrome calculator 12. The calculator 12 calculates a syndrome based on the input data and the syndrome is then stored in a syndrome buffer 13.

An OR gate 14 is coupled to the output of the syndrome buffer 13. It generates an output signal which indicates whether or not an error exists in the syndrome supplied from the syndrome buffer 13. An output signal from OR gate 14 is supplied to an error location polynomial calculator 15. Upon receipt of the signal, the calculator 15 finds the coefficients included in an error location polynomial $\sigma_{(x)}$. Data representing the coefficients are fed to an error location calculator 16. The error location calculator 16 then finds the root or roots of the error location polynomial. Data representing the root or roots are supplied from the calculator 16 to an error value calculator 17. From the input data, the calculator 17 calculates an error value. The data representing the root or roots and the data representing the error value are used to correct the data from the data buffer 11.

The calculators 12, 15, 16 and 17 of the data correcting system can detect elements which are "0" and can therefore perform algebraic operations such as addition, multiplication or division. Of these calculators, the error location polynomial calculator 16 may have such a structure as shown in FIG. 2 and disclosed in U.S. Pat. No. 4,142,174.

As shown in FIG. 2, the error location polynomial calculator 16 comprises a syndrome buffer 21, a working buffer 22, a sequence controller 23, a logarithm buffer 24 and an antilogarithm buffer 25. The syndrome buffer 21 is a random-access memory (RAM) for storing a syndrome $S_i$ which is m-bit data and which represents each element of a Galois field $GF(2^m)$. The working buffer 22 is a RAM for storing an interim result of an algebraic operation performed in finding the coefficients of the error location polynomial and for storing the final result of the algebraic operation. The working buffer 22 may store partial results that will be used in algebraic operations which follow the operations for calculating the coefficients of the error location polynomial. The sequence controller 23 defines the order in which algebraic operations will be performed. It supplies address signals to the syndrome buffer 21 and the working buffer 22, to thereby designate desired memory locations of these buffers 21 and 22 and to check and branch the results of algebraic operations so that the results may be used in the next algebraic operations. The logarithm buffer 24 is a ROM (read-only memory) storing a table of the logarithms of the elements of a Galois field $GF(2^m)$. The antilogarithm buffer 25 is also a ROM storing a table of the antilogarithms of the elements of a Galois field $GF(2^m)$.

The address of the logarithm buffer 24 is a binary code of element $\alpha^i$. Its entry is the logarithm of $\alpha$ to the base $\alpha$ that is, i. The entry at address i of the antilogarithm buffer 25 is a binary code of $\alpha^i$.

Suppose the modulus polynomial $F_{(x)}$ of a Galois field $GF(2^8)$ is given by:

$$F_{(x)} = x^8 + x^6 + x^5 + x^4 + 1.$$

The elements of Galois field $GF(2^8)$ other than element 0 can then be represented by a linear combination of powers to the root $\alpha$ of $F_{(x)}=0$, or $\alpha^0-\alpha^7$, which is expressed as follows:

$$\sum_{i=0}^{7} a_i \alpha^i, \text{ where } a_i = 0 \text{ or } 1.$$

In this case, eight coefficients $a_0$ to $a_7$ may be taken and can be represented as binary vectors. For example, they can be given by:

$$\alpha^1 = 0\cdot\alpha^0 + 1\cdot\alpha^1 + 0\cdot\alpha^2 + 0\cdot\alpha^3 + 0\cdot\alpha^4 + 0\cdot\alpha^5 + 0\cdot\alpha^6 + 0\cdot\alpha^7 = (01000000)$$

$$\alpha^7 = 0\cdot\alpha^0 +, \ldots + 0\cdot\alpha^6 + 1\cdot\alpha^7 = (00000001)$$

$$\alpha^8 = 1 + \alpha^4 + \alpha^5 + \alpha^6 = (10001110)$$

$$\alpha^9 = \alpha\cdot\alpha^8 = \alpha + \alpha^5 + \alpha^6 + \alpha^7 = (01000111).$$

The elements of the Galois field $GF(2^8)$ other than these can be represented as binary vectors.

The addresses 1-255 of the logarithm table are 8-bit binary vectors of elements $\alpha^i$. Entries corresponding to the addresses are binary notations of exponent i. In the antilogarithm table, exponent i is used as an address, and entries are binary vectors of $\alpha^i$.

How the error location polynomial calculator shown in FIG. 2 performs algebraic operations will now be described.

(1) Addition

In order to add element $\alpha^i$ and element $\alpha^j$, the former is supplied from A register 20 to an exclusive OR gate 27 and the latter is supplied from B register 26 to the exclusive OR gate 27. An exclusive logical sum of each bit of element $\alpha^i$ and the corresponding bit of element $\alpha^j$ is thus produced. The logical sum of elements $\alpha^i$ and $\alpha^j$ obtained by the exclusive OR gate 27 is transferred through C register 19 to the working buffer 22.

(2) Detection of Element "0"

In order to detect whether or not element $\alpha^i$ is "0", the element is supplied from H register 28 to an OR gate 29, which produces a logical sum. The logical sum is transferred via M register 30 to the working buffer 22. The contents of M register 30 are "0" only when element $\alpha^i$ is "0".

(3) Multiplication

In order to multiply element $\alpha^i$ by element $\alpha^j$, it is first detected whether or not these elements are "0". If at least one of these elements is "0", it is learned without performing the multiplication that the product will be "0". If neither is "0", the elements are loaded into an address register 31 which is connected to the logarithm buffer 24. Outputs i and j from the logarithm buffer 24 are supplied to a ones complement adder 34 through D register 32 and E register 33, respectively. The ones complement adder 34 performs addition of a complement to 1, using $2^8-1$ as a modulus. The result of this addition, $(i+j)=t \mod (2^8-1)$ is loaded through L register 35 into an address register 36 which is connected to the antilogarithm buffer 25. If the address input of the antilogarithm buffer 25 is t, the antilogarithm buffer 25 supplies an output $\alpha^t$. The output $\alpha^t$ is the product of elements $\alpha^i$ and $\alpha^j$ and is transferred to the working buffer 22 through G register 37.

(4) Division

In order to divide element $\alpha^i$ by element $\alpha^j$ to obtain a quotient $\alpha^i/\alpha^j$, a method similar to the above-mentioned multiplication is used, but the contents of E register 33 are subtracted from the contents of D register 32. More specifically, the logarithm of element $\alpha^j$ stored in E register 33 is complemented by a complementer 38. The output data of the complementer 38 are supplied to the complement adder 34 via F register 39. Thereafter, the data are processed in the same way as in multiplying element $\alpha^i$. In this case, the output from the antilogarithm buffer 25 is the quotient, i.e., the result of the division.

The error location polynomial calculator of the known error correcting system must be provided with a logarithm buffer and an antilogarithm buffer. Without these buffers, the error location polynomial calculator could not perform multiplication or division. Both buffers, which are ROMs, need to have an enormously large memory capacity. This makes it difficult to manufacture the error location polynomial calculator in the form of an LSI. In order to make the calculator in the form of an LSI, the logarithm buffer and the antilogarithm buffer must be excluded from the calculator. In this case, the buffers having a large memory capacity have to be connected to the calculator.

If one symbol consists of eight bits and each buffer stores 255 symbols, the buffer must have a memory capacity of 2040 bits ($=255\times 8$). In this case, the known error location polynomial calculator is provided with two ROMs the total memory capacity of which amounts to 4080 bits. One of the ROMs stores a table of logarithms and the other ROM stores a table of antilogarithms. Since its error location polynomial calculator has two ROMs both with a large memory capacity, the error correcting system is inevitably complicated, and thus expensive.

SUMMARY OF THE INVENTION

An object of the present invention is to provide an apparatus for dividing the elements of a Galois field, which has neither a logarithm buffer nor an antilogarithm buffer, both of which require a large memory capacity, and which therefore has a simple structure and can be manufactured at low cost.

An apparatus according to the present invention divides one element $\alpha^i$ of the Galois field GF($2^m$) by another element $\alpha^j$ of the Galois field GF($2^m$), where $\alpha$ is a root of modulus polynomial $F_{(x)}$. In other words, the apparatus performs the division: $\alpha^i \div \alpha^j (=\alpha^{i-j})$. $2^m$ elements of the Galois field GF($2^m$) are divided into n groups. One of the elements of each group, which is located at a specific position, is sampled, and the data representing the reciprocal of the sampled element is stored in a reciprocal data memory means. The data representing the element $\alpha^j$ of the Galois field GF($2^m$) is stored in a first linear shift register. This data is compared by comparator means with the reciprocal data which are stored in the reciprocal data memory means. The linear shift register is shifted a number of times until the data coincides with one of the reciprocal data so that the reciprocal data is read from the reciprocal data memory means. The number of times N that the linear shift register is shifted until one of the reciprocal data is read out is given as: $0 \leq N \leq n-1$. The reciprocal data $\alpha^{-(j+N)}$ read from the reciprocal data memory and the data representing element $\alpha^i$ are used in multiplying $\alpha^i$ by $\alpha^{-j}$ by means of multiplication means including a second linear shift register and means for removing the $\alpha^{-N}$ component. In other words, the division $\alpha^i \div \alpha^j$ ($=\alpha^{i-j}=\alpha^i \times \alpha^{-j}$) is performed.

According to the present invention, the elements of the Galois field GF($2^m$) are divided by using linear shift registers and multiplying the elements by means of these linear shift registers. This can reduce the memory capacity of the memory means for storing necessary reciprocal data, thus simplifying the structure of the apparatus and lowering the cost of the apparatus.

BRIEF DESCRIPTION OF THE DRAWINGS

FIG. 6 is a circuit diagram of a divider used in the apparatus shown in FIG. 4;

FIGS. 7(a) to 7(g) are timing charts illustrating how the divider shown in FIG. 6 performs its function.

DETAILED DESCRIPTION OF THE PREFERRED EMBODIMENTS

Figure 3:
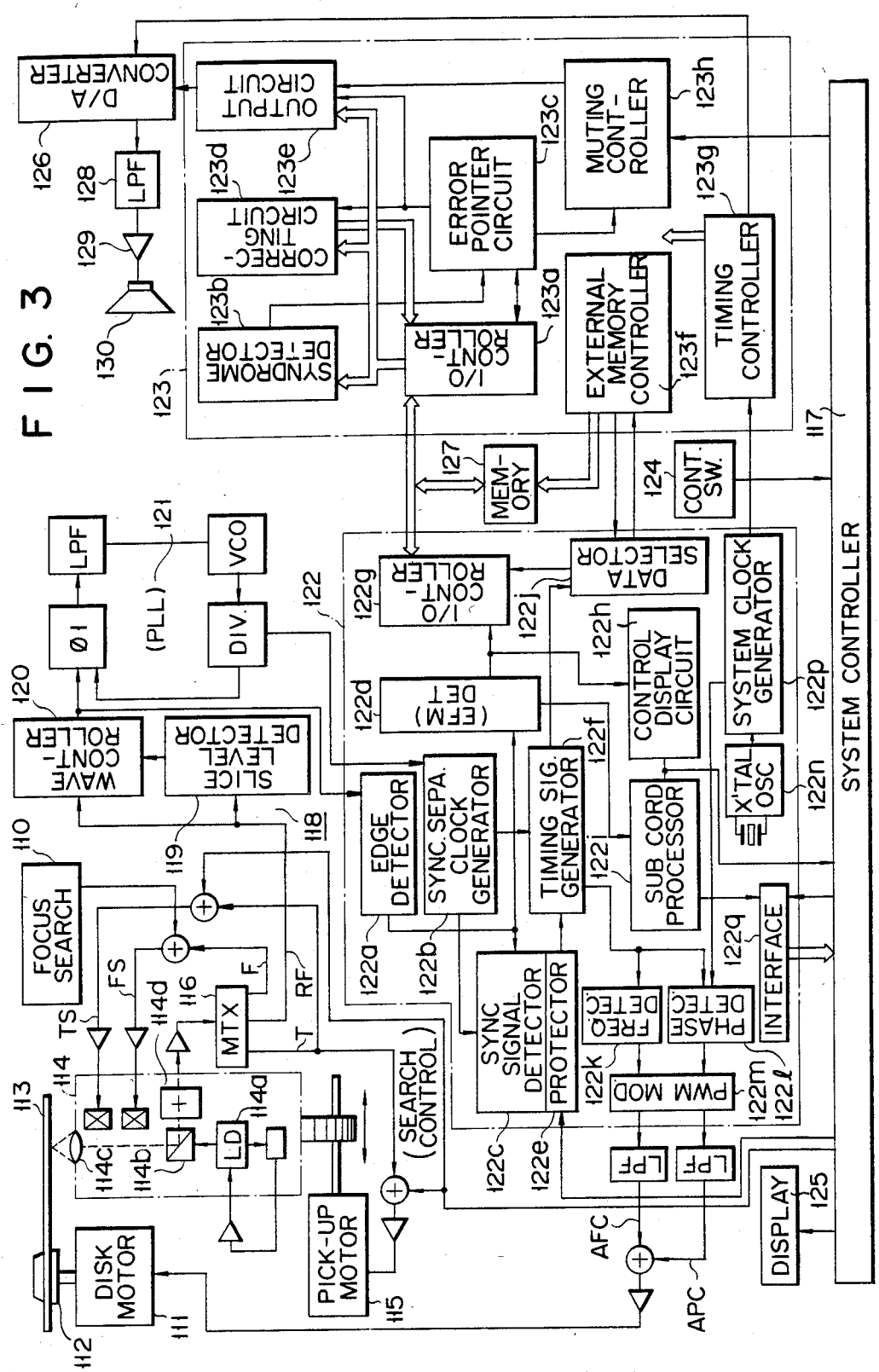
FIG. 3 is a block diagram of an optical DAD device to which the present invention is applied.

With reference to FIG. 3, an optical DAD (digital audio disk) device which uses compact disks (CD) will be described.

As shown in FIG. 3, the optical DAD device comprises a motor 111 for rotating a turntable 112. On the turntable 112 an optical disk 113 is mounted. The disk 113 has pits which correspond to digital audio signals (i.e. PCM codes) which have been EFM-modulated and interleaved. An optical pickup 114 emits a laser beam from a semiconductor laser 114a. The laser beam passes through a beam splitter 114b and is focused by an objective lens 114c. The beam illuminates the track of the optical disk 113, i.e., a train of pits which cause an interference between an incident laser beam and a reflected laser beam in various ways. The beam reflected from the pits passes through the objective lens 114c and the beam splitter 114b. It is then guided to a four-element photodetector 114d. The photodetector 114d converts the laser beam into four signals. The pickup 114 is moved by a pickup feed motor 115 in the radial direction of the optical disk 113.

The four signals from the photodetector 114d are supplied to a matrix circuit 116 and undergo a specific matrix operation. As a result, the matrix circuit 116 generates a focus error signal F, a tracking error signal T and a high-frequency signal RF. The focus error signal F and a focus search signal from a focus search circuit 110 drive a focus servo system of the optical pickup 114. The tracking error signal T and search control signal from a system controller 117 drive a tracking servo system of the pickup 114 and control the pickup feed motor 115. The high-frequency signal RF is supplied to a reproduced signal processing system 118 as a major reproduced signal component. In the system 118 the signal RF is supplied to a waveform shaping circuit 120 which is controlled by a slice level (eye pattern) detector 119. The waveform shaping circuit 120 divides the input signal into an unnecessary analog component and a necessary data component. The necessary data component is supplied to a sync clock reproducing circuit 121 of PLL type and also to an edge detector 112a of a first signal processing system 122.

A sync clock from the sync clock reproducing circuit 212 is supplied to a clock pulse generating circuit 122. In response to the sync clock, the clock pulse generating circuit 122b generates a clock pulse for dividing a sync signal into components. On the other hand, the necessary data component from the edge detector 122a is supplied to a sync signal detector 122c. The sync signal detector 122c divides the data components in response to a sync signal dividing clock pulse from the clock pulse generating circuit 122b. The necessary data component from the edge detector 122a is also supplied to a demodulating circuit 122d and then EFM-demodulated. A sync signal from the sync signal detector 122c is supplied to a sync signal protecting circuit 122e and then to a timing signal generating circuit 122f. A clock pulse signal from the clock pulse generating circuit 122b is also supplied to the timing signal generating circuit 122f. The timing signal generating circuit 122f generates a timing signal for processing input data.

An output signal from the demodulating circuit 122d is supplied through a data bus input/output control circuit 122g to an input/output control circuit 123a of a second signal processing system 123. The output signal from the demodulating circuit 122d contains a sub-code (i.e., a control signal) and a display signal component. The display signal component is supplied to a sub-code processing circuit 122i.

The sub-code processing circuit 122i detects an error, if any, from the sub-code and corrects the error and then generates sub-code data. The sub-code data is supplied to the system controller 117 through an interface circuit 122q which is connected to the system controller 117.

The system controller 117 includes a microcomputer, an interface circuit and a driver integrated circuit. In response to an instruction from a control switch 124 the system controller 117 controls the DAD device in a desired manner and causes a display device 125 to display the sub-code, e.g., index data about a piece of music to be reproduced.

A timing signal from the timing signal generating circuit 122f is supplied through a data selecting circuit 122j to the data bus input/output control circuit 122g and controls the data bus input/output control circuit 122g. The timing signal is supplied also to a frequency detector 122k and a phase detector 122l and further to a PWM modulator 122m. The timing signal from the PWM modulator 122m then undergoes automatic frequency control (AFC) and automatic phase control (APC) so as to rotate the motor 111 at a constant linear velocity (CLV).

The phase detector 112l is connected to receive a system clock pulse from a system clock pulse generating circuit 122p, which operates under the control of an output signal from a quartz crystal oscillator 122n.

The demodulated data from the input/output control circuit 123a of the second signal processing system 123 is supplied through a data output circuit 123e to a D/A (digital-to-agalog) converter 126 after it has undergone necessary error correction, de-interleaving and data supplementation at a syndrome detector 123b, and an error pointer control circuit 123c and error correction circuit 123d. The second signal processing system 123 includes an external memory control circuit 123f. The control circuit 123f cooperates with the data selecting circuit 122j of the first signal processing system 122 to control a memory circuit 127 which is provided outside the system 123 and which stores data necessary for correcting errors. Under the control of the circuits 123f and 122j, the data are read from the external memory 127 and supplied to the input/output control circuit 123a.

The second signal processing system 123 further comprises a timing control circuit 123g and a muting control circuit 123h. The timing control circuit 123g is so designed as to supply, in response to a system clock pulse from the system clock pulse generating circuit 122p, a timing control signal which is necessary for correcting errors, supplementing data and converting digital data into analog data. The muting control circuit 123h is designed to operate in response to a control signal from the error pointer control circuit 123c or from the system controller 117, thus performing a specific muting control which is necessary in supplementing data and in starting and ending DAD reproduction.

An audio signal, or an analog output signal from the D/A converter 126 is supplied through a low-pass filter 128 and an amplifier 129 to a loudspeaker 130.

Now an apparatus according to the invention will be described which is used in the error correcting system of the optical DAD device shown in FIG. 3.

Figure 1:
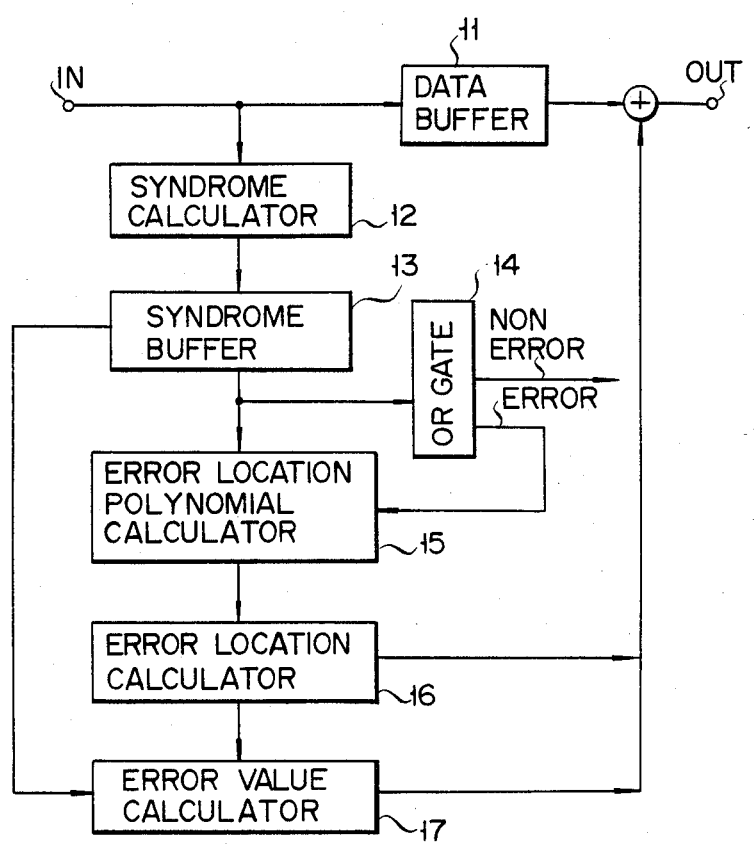
FIG. 1 schematically shows a system for decoding a Reed Solomon code.
Figure 2:
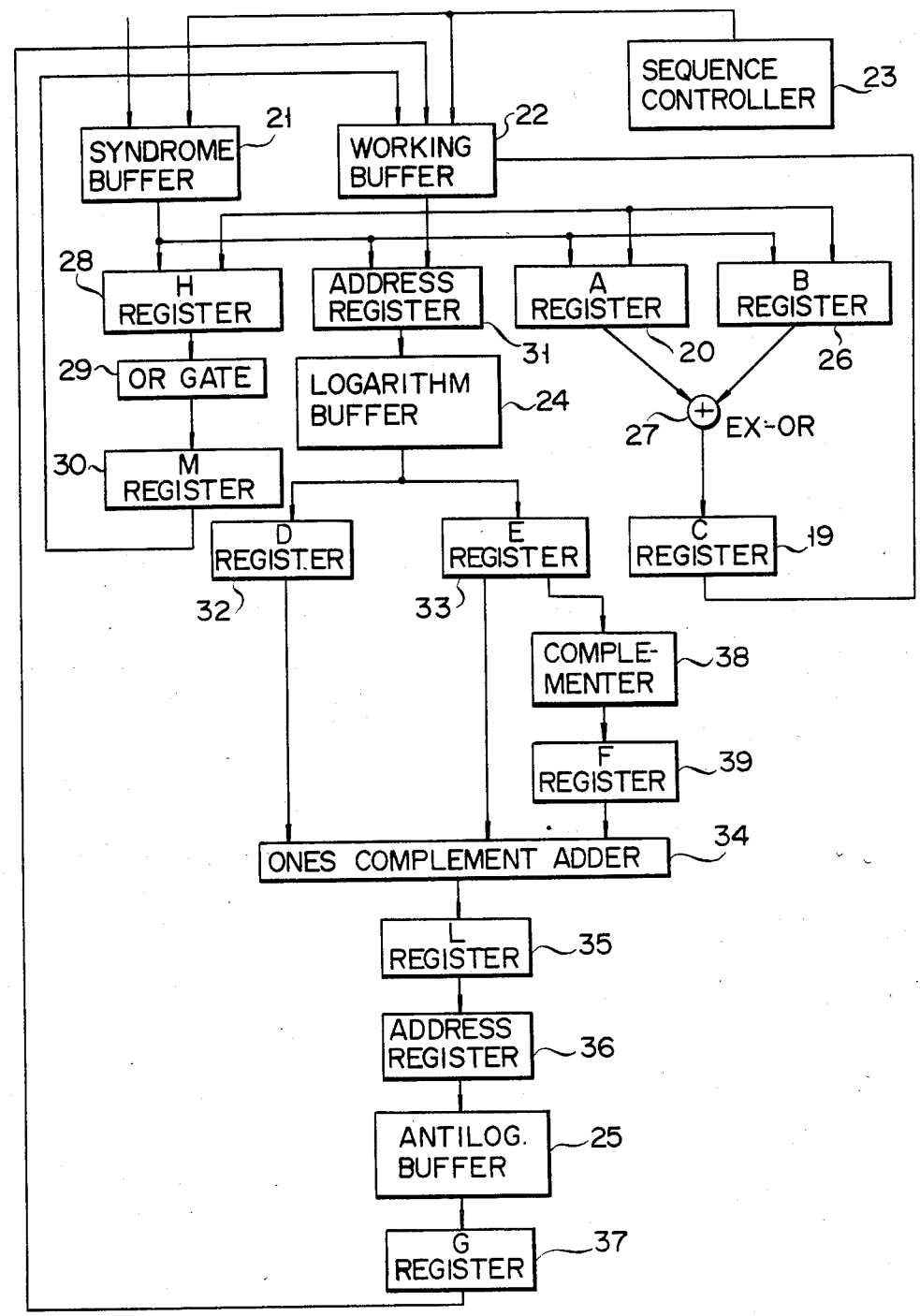
FIG. 2 schematically shows a conventional error location polynomial calculator.
Figure 4:
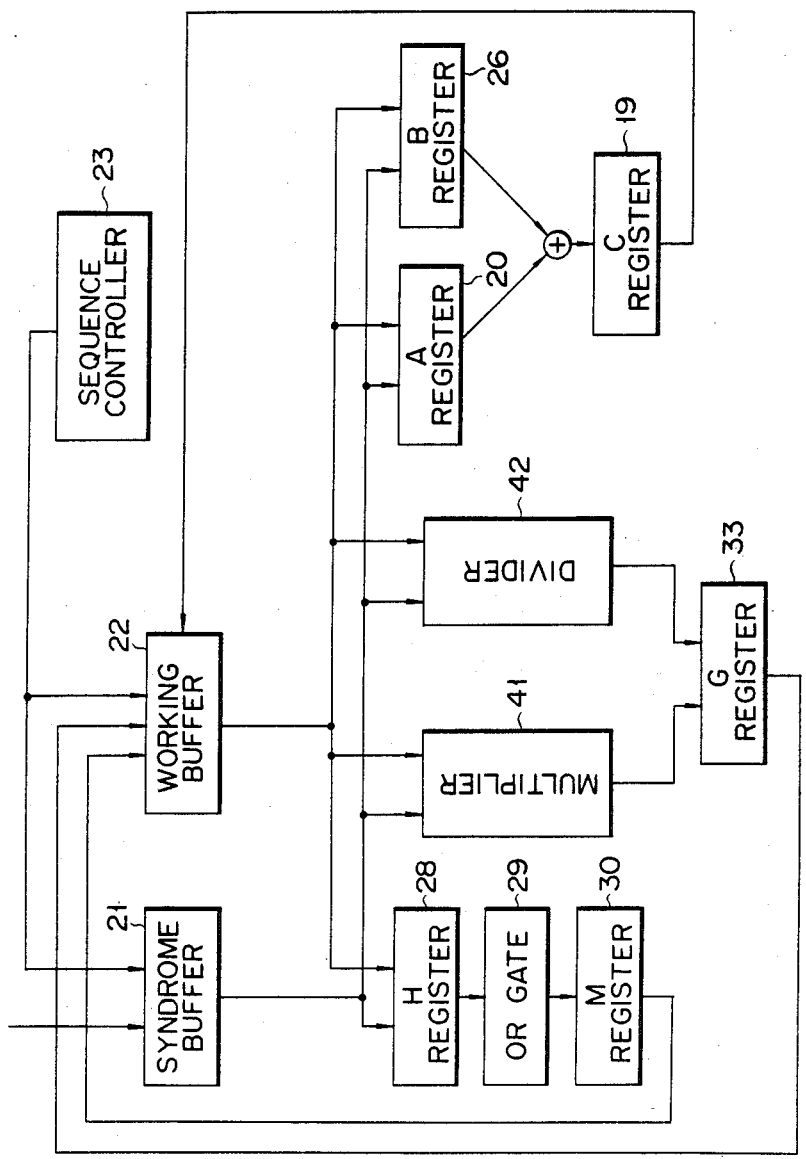
FIG. 4 is a block diagram of an apparatus according to the invention.

FIG. 4 shows an error location polynomial calculator provided in the error correcting circuit 123d of the second signal processing system 123. The calculator is identical to the conventional calculator shown in FIG. 2, except that it is provided with a multiplier 41 and a divider 42 which multiply and divide the elements of a Galois field. The apparatus of the invention can therefore divide the elements of a Galois field, although it has neither a logarithm buffer nor an antilogarithm buffer.

The function of the error location polynomial calculator is to perform various algebraic operations and thereby to decode an error correction code, i.e., a Reed Solomon code which is a BCH code. The calculator performs addition and detection of element "0" in the same way as the calculator shown in FIG. 2. It performs multiplication and division in different ways, however. How the calculator achieves multiplication and division will be described below in detail.

Element $\alpha^i$ of Galois field $GF(2^8)$, for example, is multiplied by element $\alpha^j$ of the Galois field $GF(2^8)$, where $\alpha$ is the root of a modulus polynomial $F_{(x)} = X^8 + X^6 + X^5 X^4 + 1$. Let $\alpha^i$ and $\alpha^j$ be given as follows:

$$\alpha^i = C(\alpha) = c_0 + c_1\alpha + \ldots + c_7\alpha^7$$

$$\alpha^j = D(\alpha) = d_0 + d_1\alpha + \ldots + d_7\alpha^7,$$

where $c_0$–$c_7$ and $d_0$–$d_7$ are each either 1 or 0. Then:

$$\begin{aligned}\alpha^i \cdot \alpha^j &= C(\alpha) \cdot D(\alpha) \\ &= d_7\alpha^7 C(\alpha) + d_6\alpha^6 C(\alpha) \ldots + d_0 C(\alpha) \\ &= \alpha^6[\alpha d_7 C(\alpha) + d_6 C(\alpha)] + d_5\alpha^5 C(\alpha) + \ldots + d_0 C(\alpha) \\ &= \alpha^5[\alpha[\alpha d_7 C(\alpha) + d_6 C(\alpha)] + \\ &\qquad d_5 C(\alpha)] + d_4\alpha^4 C(\alpha) + \ldots + d_0 C(\alpha) \\ &\vdots \\ &= [\alpha[\alpha[\alpha[\alpha[\alpha[\alpha d_7 C(\alpha) + d_6 C(\alpha)] + d_5 C(\alpha)] + \\ &\qquad d_4 C(\alpha)] + d_3 C(\alpha)] + d_2 C(\alpha)] + d_1 C(\alpha) + d_0 C(\alpha)].\end{aligned}$$

Figure 5:
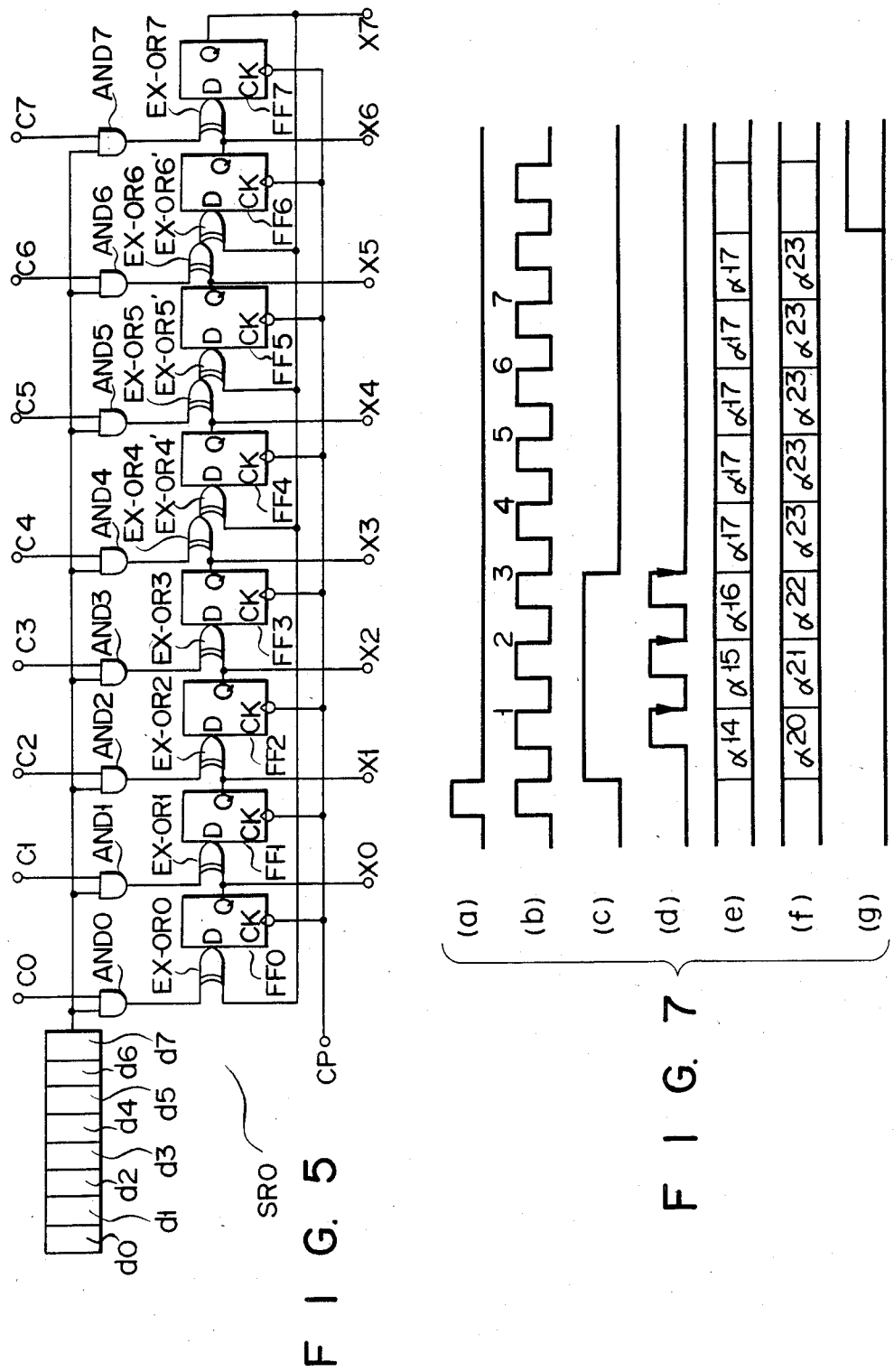
FIG. 5 is a circuit diagram of a multiplier used in the apparatus shown in FIG. 4.

The equation given above shows that the multiplication, $\alpha^i \cdot \alpha^j$, can be performed by such a multiplier, or a linear shift register, as shown in FIG. 5.

The multiplier shown in FIG. 5 comprises AND gates $AND_0$ to $AND_7$. The coefficients $d_0$ to $d_7$ of the multiplier $D(\alpha)$ are supplied to the multiplier one after another. More specifically, the least significant bit $d_7$ is first supplied to one input of the AND gate $AND_0$, the second least significant bit $\alpha_6$ is then supplied to one input of the AND gate $AND_0$ while the bit $d_7$ is supplied to one input of the AND gate $AND_1$, the third least significant bit $\alpha_5$ is supplied to the AND gate $AND_0$ while the bits $\alpha_7$ and $\alpha_6$ are supplied to the $AND_2$ and $AND_1$, and so forth. The coefficients $c_0$ to $c_7$ of the multiplicand $C(\alpha)$ are simultaneously supplied to the other inputs of the AND gates $AND_0$ to $AND_7$, respectively. The multiplier further comprises flip-flop circuits $FF_0$ to $FF_7$ and exclusive OR gates $EX$-$OR_0$ to $EX$-$OR_7$. The flip-flop circuits $FF_0$ to $FF_7$ are connected by the exclusive OR gates $EX$-$OR_0$ to $EX$-$OR_7$ which are connected at one input to the outputs of the AND gates $AND_0$ to $AND_7$, respectively. The output of the flip-flop $FF_7$ is coupled by a feedback line to the other input of the flip-flop circuit $FF_0$. The flip-flop circuits $FF_0$ to $FF_7$ therefore form a linear shift register $SR_0$.

An exclusive OR gate EX-OR$_4'$ is connected at one input to the output of the exclusive EX-OR$_4$ and at the other input to the feedback line. Similarly, an exclusive OR gate EX-OR$_5'$ is connected at one input to the output of the exclusive OR gate EX-OR$_5$ and at the other input to the feedback line. In similar manner, an exclusive OR gate EX-OR$_6'$ is connected between the sixth flip-flop circuit $FF_5$ and the seventh flip-flop circuit $FF_6$. The clock terminals CK of the flip-flop circuits $FF_0$ to $FF_7$ are connected by a clock supply line to a clock pulse generator (not shown) so that a clock pulse may be supplied to the flip-flop circuits $FF_0$ to $FF_7$ at the same time.

The coefficients $d_0$ to $d_7$ of the multiplier $D(\alpha)$ are supplied one after another to the AND gates $AND_0$ and $AND_7$, respectively. Then, $X_0, X_1, X_2, \ldots X_7$ are calculated one after another, whereby the linear shift register $SR_0$ calculates $C(\alpha) \cdot D(\alpha)$. The output signals $x_0, x_1, \ldots x_7$ from the flip-flop circuits $FF_0$ to $FF_7$ therefore represent the product of the multiplicand $C(\alpha)$ and the multiplier $D(\alpha)$.

$x_0$ to $x_7$ are given as follows:

$X_0 = d_7 C(\alpha)$ $X_1 = X_0 + d_6 C(\alpha)$ $X_2 = X_1 + d_5 C(\alpha)$ $X_3 = X_2 + d_4 C(\alpha)$ $X_4 = X_3 + d_3 C(\alpha)$ $X_5 = X_4 + d_2 C(\alpha)$ $X_6 = X_5 + d_1 C(\alpha)$ $X_7 = X_6 + d_0 C(\alpha) = (x_0, x_1, \ldots x_7)$ The multiplier comprises a linear shift register instead of ROMs with large memory capacities which must store a logarithm table and an antilogarithm table of the elements of the Galois field $GF(2^8)$. By not using a logarithm buffer or an antilogarithm buffer, the multiplier is simple in structure, inexpensive, and can still multiply the elements of a Galois field $GF(2^m)$.

Element $\alpha^i$ of the Galois field $GF(2^8)$, for example, is divided by element $\alpha^j$ of the Galois field $GF(2^8)$, where $\alpha$ is the root of modulus polynomial $F_{(x)} = x^8 + x^6 + x^5 + x^4 + 1$. To achieve the division $\alpha^i \div \alpha^j$, the divider $\alpha^j$ is covered to a reciprocal $\alpha^{-j}$ and the divided $\alpha^i$ is multiplied by the reciprocal $\alpha^{-j}$. In other words, the multiplication $\alpha^i \cdot (\alpha^{-j})$ is performed by such a linear shift register as shown in FIG. 5.

Reciprocal $\alpha^{-j}$ of the divider $\alpha^j$ may be obtained by a converter made of a ROM which supplies data representing the reciprocal $\alpha^{-j}$ ($=\alpha^{255-j}$) upon receipt of input data representing the divider $\alpha^j$. If this method is used, however, a conversion table of reciprocals $\alpha^{-1}$ to $\alpha^{-255}$ which correspond to elements $\alpha^1$ to $\alpha^{255}$ will be required. This means that a 2040-bit (i.e., $8 \times 255$ bits) decoder and a 2040-bit (i.e., $8 \times 255$ bits) encoder will be necessary. In other words, the error location polynomial calculator will need to have ROMs having a total memory capacity of 4080 bits.

According to the present invention, $2^m$ elements of the Galois field $GF(2^m)$ are divided into n groups. Data representing the reciprocal of one element located at a specific location in each group is stored in a converter. That is, the converter stores a conversion table of the reciprocals of only n elements. In order to obtain the reciprocal data about any element other than those located at the specific locations in the respective groups, the data representing the element is shifted in the linear shift register shown in FIG. 5. This method of dividing the elements of Galois field $GF(2^m)$ requires a ROM whose memory capacity is 1/n times the memory capacity which a ROM in the conventional error location polynomial calculator would otherwise have.

FIG. 6 shows an apparatus which can divide the elements of the Galois field $GF(2^8)$ in the manner described above. The apparatus comprises a converter 51. The converter 51 includes a decoder 511 and an encoder 512, both being ROMs storing data representing the reciprocal $\alpha^{255-x}$ which is supplied from the converter 51 when the converter 51 receives data representing an element of each of n groups which is located at the first location, i.e., element $\alpha^x$. In this embodiment, $n = 32$ and the first element of each group is denoted by $\alpha^1$. The converter 51 stores a table of reciprocal conversions concerning elements $\alpha^{8k+1}$, where $k = 0, 1, 2, \ldots 31$. The table is as shown below:

| Address | Entry | Address | Entry |
|---------|----------|---------|----------|
| 1 | 01000000 | 254 | 00011101 |
| 9 | 01000111 | 246 | 01001100 |
| 17 | 11101001 | 238 | 10001111 |
| 25 | 10001011 | 230 | 10011101 |
| 33 | 01111010 | 222 | 01101010 |
| 41 | 01000101 | 214 | 01000110 |
| 49 | 11110010 | 206 | 01011101 |
| 57 | 10100111 | 198 | 01011111 |
| 65 | 10001101 | 190 | 01100101 |
| 73 | 01010111 | 182 | 11111101 |
| 81 | 00110001 | 174 | 11111110 |
| 89 | 11110110 | 166 | 11011001 |
| 97 | 10010001 | 158 | 00001101 |
| 105 | 11010101 | 150 | 10000001 |
| 113 | 10100100 | 142 | 00111011 |
| 121 | 00010101 | 134 | 10000101 |
| 129 | 01101101 | 126 | 01001111 |
| 137 | 00110011 | 118 | 10101000 |
| 145 | 11101101 | 110 | 01001001 |
| 153 | 10111101 | 102 | 11100110 |
| 161 | 00100010 | 94 | 11111100 |
| 169 | 10110110 | 86 | 11100011 |
| 177 | 11010110 | 78 | 10010101 |
| 185 | 00111100 | 70 | 10000010 |
| 193 | 00101111 | 62 | 00011100 |
| 201 | 01101111 | 54 | 01010001 |
| 209 | 00101000 | 46 | 11000011 |
| 217 | 11000001 | 38 | 00010010 |
| 225 | 01001010 | 30 | 11110111 |
| 233 | 00110000 | 22 | 00101100 |
| 241 | 01110101 | 14 | 00011011 |
| 249 | 10000111 | 6 | 00000010 |

When any address shown in the table is designated, the converter 51 outputs reciprocal data representing the reciprocal of the element $\alpha^{8k+1}$ corresponding to the address. When any address other than those shown in the table is designated, the converter 51 outputs no reciprocal data.

The apparatus shown in FIG. 6 further comprises two linear shift registers 52 and 53, both being identical to the linear shift register $SR_0$ shown in FIG. 5. Data representing dividend $\alpha^i$ and data representing divider $\alpha^j$ are stored in these shift registers 52 and 53, respectively. The dividend $\alpha^i$ and divider $\alpha^j$ are expressed as follows:

$$\alpha^i = a_0 + a_1\alpha + \ldots + a_7\alpha^7, \text{ where } a_0 \text{ to } a_7 = 0 \text{ or } 1$$

$$\alpha^j = b_0 + b_1\alpha + \ldots + b_7\alpha^7, \text{ where } b_0 \text{ to } b_7 = 0 \text{ or } 1.$$

The output data from the shift register 52 are supplied to the multiplier input terminals of a multiplier 54. The output data from the shift register 53 are supplied to the input terminals of the decoder 511 of the converter 51. The output data from the encoder 512 of the converter 51 are supplied to the multiplicand input terminals of the multiplier 54 and also to the input terminals of a NOR gate $NOR_1$. The output from the NOR gate $NOR_1$ is supplied to one input terminal of an AND gate $AND_{10}$, the other input terminal of which is connected to the clock pulse generator (not shown). The output from the NOR gate $NOR_1$ is used to generate a control clock signal SCK-1 for controlling the shift registers 52 and 53.

The multiplier 54 has the same structure as the multiplier illustrated in FIG. 5.

The apparatus shown in FIG. 6 performs the division $\alpha^i \div \alpha^j$ in the following manner. If the data stored in the shift register 53 and representing the divider $\alpha^j$ are found in the conversion table which is stored in the converter 51, the reciprocal data $\alpha^{-j}$ from the converter 51 is supplied as multiplier data to the multiplier 54. The data stored in the shift register 52 and representing the dividend $\alpha^i$, or multiplicand $\alpha^i$ are supplied to the multiplier 54. The multiplier 54 multiplies the multiplicand $\alpha^i$ by the multiplier $\alpha^{-j}$.

If the data stored in the shift register and representing the divider $\alpha^j$ are not found in the conversion table stored in the converter 51, the divider $\alpha^j$ is repeatedly multiplied by $\alpha$(N times; $0 \leq N \leq 7$) until $\alpha^{j+N}$ becomes equal to one of the elements $\alpha^{8k+1}$ of the conversion table. In this way, a reciprocal data $\alpha^{-(j+N)}$ is obtained. The dividend $\alpha^i$ is also multiplied by $\alpha^N$, thus providing data representing $\alpha^{i+N}$. The result of the multiplication performed by the multiplier 54 is thus:

$$\alpha^{i+N} \cdot \alpha^{-(j+N)} = \alpha^{i-j}.$$

Component $\alpha^{-N}$ can therefore be removed. Any element $\alpha^i$ of the Galois field GF($2^8$) can thus be divided by any other element of the Galois field even if a conversion table of all elements $\alpha^1$ to $\alpha^{255}$ is not stored in the converter 51.

In order to multiply $\alpha^i$ and $\alpha^j$ by $\alpha^N$, it is sufficient to shift the linear shift registers 52 and 53 N times as they receive control clock signals SCK-1 from the AND gate $AND_{10}$. This is because control clock signals SCK-1 are supplied from the AND gate $AND_{10}$ which produces a logical product of the output from the NOR gate $NOR_1$ and a clock pulse CP, as long as the NOR gate $NOR_1$ keeps generating outputs of logical "1" level. In other words, the AND gate $AND_{10}$ continues to generate control clocks SCK-1 until the converter 51 receives divider data $\alpha^j$ which is identical to data $\alpha^{8k+1}$. Every time the shift register 52 receives a control clock SCK-1, $\alpha^i$ is multiplied by $\alpha$. Similarly, every time the shift register 53 receives a control clock signal, SCK-1, $\alpha^j$ is multiplied by $\alpha$.

How the apparatus shown in FIG. 6 divides element $\alpha^{20}$ by element $\alpha^{14}$ will now be described. First, data representing element $\alpha^{20}$, i.e., digital data (10110000), are supplied to the shift register 52, and data representing element $\alpha^{14}$, i.e., digital data (00011011), are supplied to the register 53. Data representing the reciprocal of $\alpha^{14}$ are not stored in the converter 51, however. Both shift registers 52 and 53 therefore need to be shifted. When they are shifted three times, the data stored in the shift register 53 are changed to $\alpha^{17}$ (=(11101001)) and the data stored in the shift register 52 are changed to $\alpha^{23}$ (=(00010110)). The data representing $\alpha^{17}$, i.e., digital data (11101001), are supplied to the converter 51. Since the data representing the reciprocal of $\alpha^{17}$ are stored in the converter 51, the converter 51 supplies output data representing $\alpha^{255-17}$ (=$\alpha^{238}$), i.e., digital data (10001111). Data representing $\alpha^{23}$ are supplied from the shift register 32 to the multiplier 54, and data representing $\alpha^{238}$ are supplied from the converter 51 to the multiplier 54. The multiplier 54 multiplies $\alpha^{23}$ by $\alpha^{238}$, thus providing a product $\alpha^6$ (=(00000010). In this way, the apparatus of FIG. 6 performs the division: $\alpha^{20} \div \alpha^{14}$.

FIGS. 7(a) to 7(g) are timing charts illustrating how the apparatus of FIG. 6 operates to divide element $\alpha^{20}$ of the Galois field GF($2^8$) by element $\alpha^{14}$ of the Galois field. FIG. 7(a) shows a pulse signal for supplying data representing element $\alpha^{20}$ to the shift register 53 and data representing element $\alpha^{14}$ to the shift register 52. FIG. 7(b) shows clock pulses CP. FIG. 7(c) shows an output from the NOR gate $NOR_1$. FIG. 7(d) shows control clock signals SCK-1. FIG. 7(e) and FIG. 7(f) show the contents of the shift register 52 and the contents of the shift register 53, respectively. FIG. 7(g) shows the time at which the multiplier 54 starts functioning.

Figure 8:
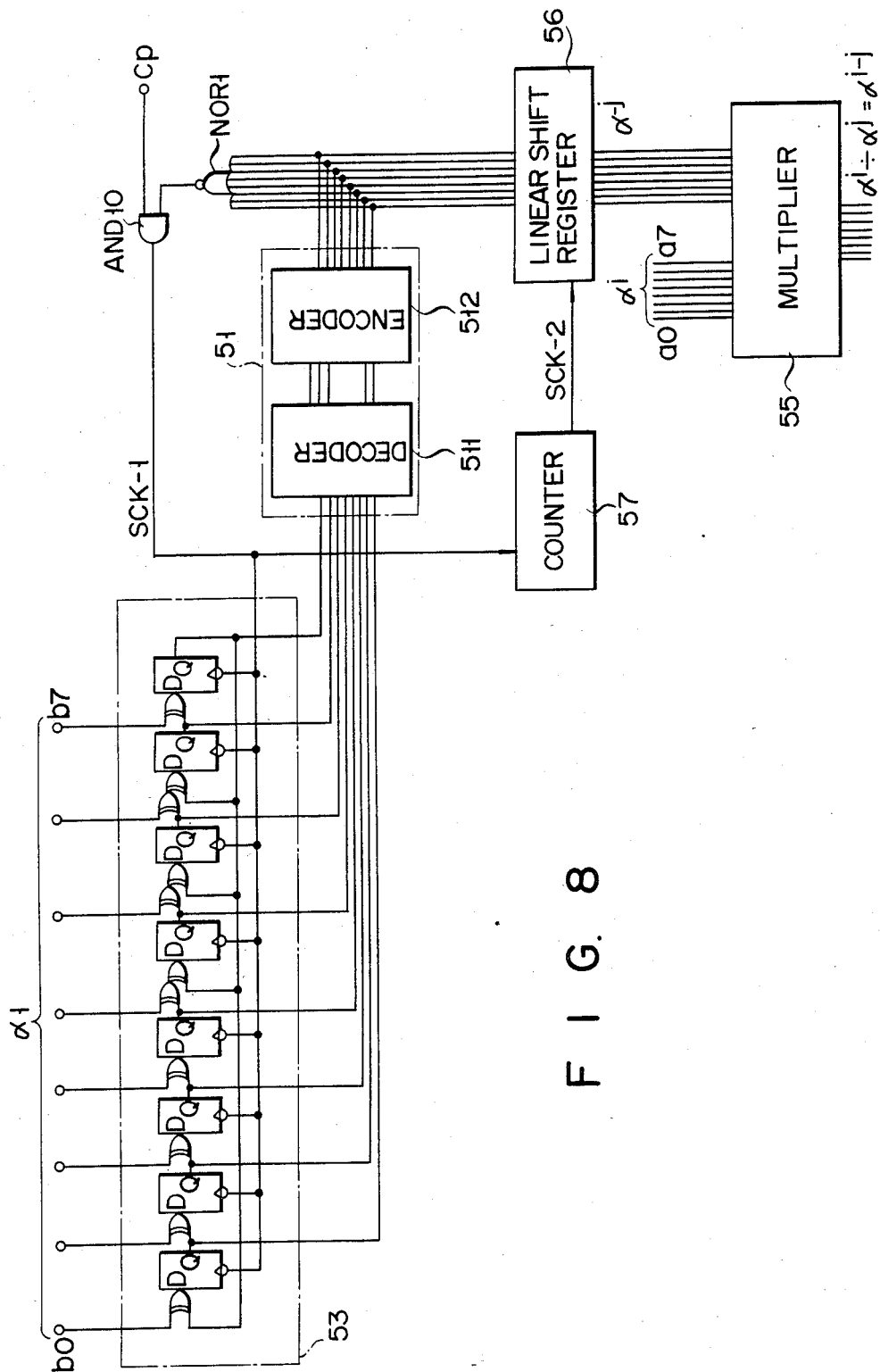
FIG. 8 is a circuit diagram of a divider used in another apparatus according to the present invention.

FIG. 8 illustrates another apparatus of the present invention for dividing the elements of the Galois field GF($2^8$). The apparatus comprises a linear shift register 53 which is designed to receive data representing divider $\alpha^j$ and to supply the data to a decoder 511 provided in a converter 51. An encoder 512 is provided in the converter 51 and connected to the output of the decoder 511. Output data from the encoder 512 are supplied to a linear shift register 56 and also to the input terminals of a NOR gate $NOR_1$. The output from the NOR gate $NOR_1$ is supplied to an AND gate $AND_{10}$. The AND gate $AND_{10}$ generates a control clock SCK-1 when it receives the output from the NOR gate $NOR_1$ and a clock pulse CP. The control clock signal SCK-1, i.e., the logical product of the output from the NOR gate $NOR_1$ and the clock pulse CP, is supplied to the shift register 53 and controls the same. The control clock signal SCK-1 is supplied to a counter 57 and is then used as a control clock signal SCK-2 for controlling the shift register 56.

The apparatus shown in FIG. 8 further comprises a multiplier 55. The multiplier 55 receives data representing dividend $\alpha^i$. It also receives data representing the divider $\alpha^j$ supplied from the shift register 56. The dividend $\alpha^i$ and the divider $\alpha^j$ are given as follows:

$$\alpha^i = a_0 + a_1\alpha + \ldots + a_7\alpha^7, \text{ where } a_0 \text{ to } a_7 = 0 \text{ or } 1$$

$$\alpha_j = b_0 + b_1\alpha + \ldots + b_7\alpha^7, \text{ where } b_0 \text{ to } b_7 = 0 \text{ or } 1.$$

The shift register 53 is identical with the linear shift register $SR_0$ shown in FIG. 5. The multiplier 55 is identical with the multiplier 54 shown in FIG. 6.

If the data stored in the shift register 53 and representing the divider $\alpha^j$ are found in a conversion table which is stored in the converter 51, the data representing the reciprocal $\alpha^{-j}$ of the divider $\alpha^j$ are supplied from the converter 51 as multiplier data to the multiplier 55 through the shift register 56. The multiplier 55 multiplies the dividend $\alpha^i$ supplied to it by the reciprocal $\alpha^{-j}$. In other words, the multiplier 55 performs the multiplication: $\alpha^i \cdot \alpha^{-j}$.

If the data stored in the shift register 53 and representing the divider $\alpha^j$ are not found in the conversion table stored in the converter 51, the divider $\alpha^j$ is repeatedly multiplied by (N times; $0 \leq N \leq 7$) until $\alpha^{j+N}$ becomes equal to one of the elements $\alpha^{8k+1}$ of the conversion table. In this way, the reciprocal data $\alpha^{-(j+N)}$ is obtained. If the reciprocal data $\alpha^{-(j+N)}$, i.e., $\alpha^{-j} \cdot \alpha^{-N}$, is multiplied by $\alpha^N$, then:

$$\alpha^{-j} \cdot \alpha^{-N} \cdot \alpha^N = \alpha^{-j}.$$

As result, a desired reciprocal data $\alpha^{-j}$ which contains no component $\alpha^{-N}$ is provided.

The divider $\alpha^j$ is repeatedly multiplied by $\alpha$ as the linear shift register 53 is shifted N times so that the converter 51 generates reciprocal data $\alpha^{-(j+N)}$. The reciprocal $\alpha^{-(j+N)}$ is multiplied by $\alpha^N$ as the linear shift register 56 is shifted N times, so that the shift register 56 generates desired reciprocal data $\alpha^{-j}$.

The shift register 53 is automatically shifted N times. This is because control clock signals SCK-1 are supplied to the shift register 53 from the AND gate AND$_{10}$ which produces a logical product of the output from the NOR gate NOR$_1$ and a clock pulse CP, as long as the NOR gate NOR$_1$ keeps generating outputs of logical "1" level. In other words, the AND gate AND$_{10}$ continues to generate control clock signals SCK-1 until the converter 51 receives divider data $\alpha^j$ which is identical with data $\alpha^{8k+1}$. Every time the shift register 52 receives a control clock SCK-1, $\alpha^i$ is multiplied by $\alpha$.

The shift register 56 which stores the reciprocal data $\alpha^{-(j+N)}$ is automatically shifted N times, too. This is because the counter 57 counts the control clock signals SCK-1 from the AND gate AND$_{10}$ and supplies them as control clock signals SCK-2 to the linear shift register 56. The number of control clock signals SCK-2 supplied to the shift register 56 is of course the same as that of control clock signals SCK-1 supplied to the shift register 53. Every time the shift register 56 receives a control clock signal SCK-2, the reciprocal data $\alpha^{-(j+N)}$ is multiplied by $\alpha^N$.

The data representing element $\alpha^i$ and the data representing element $\alpha^{-j}$ are supplied to the multiplier 55. And the multiplier 55 multiplies element $\alpha^i$ by element $\alpha^{-j}$, thus performing the division: $\alpha^i \div \alpha^j$.

More specifically, the apparatus shown in FIG. 8 divides element $\alpha^{80}$ of the Galois field GF($2^8$) by element $\alpha^{110}$ of the Galois field in the following manner. In other words, it performs the division of $\alpha^{80} \div \alpha^{110}$ ($=\alpha^{-30}=\alpha^{225}$) as will be described below.

First, data representing the divider $\alpha^{110}$ ($=01001001$) are supplied to the linear shift register 53. Since the data representing the reciprocal of $\alpha^{110}$ are not stored in the converter 51, the shift register 53 is shifted. When the shift register 53 is shifted for the third time, the data are changed to $\alpha^{113}$, which is generally expressed as $\alpha^{8k+1}$ and the reciprocal of which is thus stored in the converter 51. The converter 51 then provides data representing the following:

$$\alpha^{255-(8k+1)} = \alpha^{255-113} = \alpha^{142} = (00111011).$$

The data representing $\alpha^{142}$ are supplied to the shift register 56. The shift register 56 is shifted three times, thus changing the input data to $\alpha^{145}$ which is the reciprocal of the divider $\alpha^{110}$. Data representing $\alpha^{110}$ are supplied to the multiplier 55. Data representing the dividend $\alpha^{80}$ are also supplied to the multiplier 55. The multiplier 55 multiplies the dividend $\alpha^{80}$ by the reciprocal $\alpha^{145}$ of the divider $\alpha^{110}$. That is:

$$\alpha^{80} \cdot \alpha^{145} = \alpha^{225}.$$

As described above, according to the invention one of the elements of the Galois field GF($2^m$) is divided by another element of the Galois field GF($2^m$) by multiplying the first element by the reciprocal of the second element. The division can therefore be achieved without using a logarithm buffer or an antilogarithm buffer, that is, without a ROM having a great memory capacity storing either a logarithm table or an anti-logarithm table. A memory of a relatively small memory capacity suffices to store data necessary for obtaining data representing the reciprocal of each divider.

The present invention is not limited to the embodiments described above. Various changes and modifications are possible within the scope of the invention. For example, the apparatus of the invention may be used in combination with a system for recording, reproducing and transmitting digital data such as PCM data, a system for processing such data or any other system in which one of the elements of the Galois field needs to be divided by another element of the Galois field.

As described above in detail, the present invention can provide an apparatus for dividing the elements of a Galois field, which has neither a logarithm buffer nor an antilogarithm buffer, both of which require a large memory capacity, and which therefore has a simple structure and can be manufactured at low cost.

What we claim is:

1. An apparatus for dividing one element $\alpha^i$ of a Galois field GF($2^m$), consisting of $2^m$ elements divided into n groups, by another element $\alpha^j$, thus performing a division of:

$\alpha^i \div \alpha^j$ ($=\alpha^{i-j}$), where $\alpha$ is the root of a modulus polynomial $F_{(x)}$, said apparatus comprising:

reciprocal data memory means for storing data representing reciprocals of n elements located at specific positions respectively in n groups;

a first linear shift register for storing data representing the element $\alpha^j$;

comparator means for comparing the data stored in said first linear shift register with the data stored in said reciprocal data memory means, to thereby deliver data representing the reciprocal of the data stored in said reciprocal data memory means;

first shifting means for detecting the number of times said reciprocal data memory means produces no output when said comparator means performs the data comparison, and for generating a shift signal to shift said first linear shift register by N times according to the detecting result;

a second linear shift register for storing data $\alpha^{-(j+N)}$ from said reciprocal data memory means;

second shifting means for counting said shift signal from said first shifting means and shifting said second linear shift register a number of times determined by the counting result; and multiplier means for multiplying $\alpha^{-(j+N)+N} = \alpha^{-j}$, output from said second linear shift register, by said element $\alpha^i$, thereby providing an output of $\alpha^{i-j}$, where $0 \leq N \leq n-1$.

2. An apparatus for dividing one element $\alpha^i$ of a Galois field GF($2^m$), consisting of $2^m$ elements divided into n groups, by another element $\alpha^j$, thus performing a divison of:

$\alpha^i \div \alpha^j (=\alpha^{i-j})$, where $\alpha$ is the root of a modulus polynomial $F_{(x)}$, said apparatus comprising:

reciprocal data memory means for storing data representing reciprocals of n elements located at specific positions respectively in n groups;

a first linear shift register for storing data representing the element $\alpha^j$;

comparator means for comparing the data stored in said first linear shift register with the data stored in said reciprocal data memory means, to thereby deliver data representing the reciprocal of the data stored in said reciprocal data memory means;

a second linear shift register for storing data representing the element $\alpha^i$;

shifting means for detecting the number of times said reciprocal data memory means produces no output when said comparator means performs the data comparison, and for generating a shift signal to shift said first and second linear shift registers by N times according to the detecting result; and multiplier means for multiplying $\alpha^{-(j+N)}$, output from said reciprocal data memory means, by $\alpha^{i+N}$, output from said second linear shift register, thereby providing an output of $\alpha^{i-j}$, where $0 \leq N \leq n-1$.

* * * * *